(12) United States Patent
Beffa

(10) Patent No.: US 7,522,024 B2
(45) Date of Patent: Apr. 21, 2009

(54) NEGATIVE $G_M$ CIRCUIT, A FILTER AND LOW NOISE AMPLIFIER INCLUDING SUCH A FILTER

(75) Inventor: Federico Alessandro Fabrizio Beffa, Ticino (CH)

(73) Assignee: MediaTek Inc., Hsin-Chu (TW)

( * ) Notice: Subject to any disclaimer, the term of this patent is extended or adjusted under 35 U.S.C. 154(b) by 59 days.

(21) Appl. No.: 11/784,258

(22) Filed: Apr. 6, 2007

(65) Prior Publication Data

US 2008/0246538 A1    Oct. 9, 2008

(51) Int. Cl.
*H01H 11/00*    (2006.01)
(52) U.S. Cl. .................................. 333/217; 327/206

(58) Field of Classification Search .................. 333/213, 333/216, 217; 327/205, 206
See application file for complete search history.

(56) References Cited

U.S. PATENT DOCUMENTS

| 4,053,798 A | * | 10/1977 | Koike et al. .................. 365/159 |
| 5,422,563 A | * | 6/1995 | Pflueger ..................... 323/312 |

* cited by examiner

*Primary Examiner*—Don P Le
(74) *Attorney, Agent, or Firm*—Fish & Richardson P.C.

(57) ABSTRACT

A circuit for synthesising a negative resistance, comprising first and second active devices, the first device having a control terminal connected to a first node, and the second device having a current flow terminal connected to the first node, and the first and second devices interacting with each other such that the circuit synthesises a negative resistance.

19 Claims, 5 Drawing Sheets

NEGATIVE $G_M$ CIRCUIT, A FILTER AND LOW NOISE AMPLIFIER INCLUDING SUCH A FILTER

FIELD OF THE INVENTION

The present invention relates to negative $g_m$ circuit suitable for use in a filter, a filter and to a low noise amplifier including such a filter. Such filters are of particular interest in frequency division duplex communication systems and in systems where a receiver has to operate in the presence of a large blocking or interfacing signal at a pre-known frequency.

BACKGROUND TO THE INVENTION

Frequency division duplex (FDD) communication systems are communication systems where information is simultaneously sent in both directions, for example from a first node to a second node and from a second node to a first node. To avoid the data transmissions between nodes disturbing or interfering with one another, the two frequency division duplex links work at different frequencies. Examples of systems employing this technique include several 3G cellular mobile telephone systems including UMTS and CDMA 2000.

In such designs the degree of isolation between the transmitter and the receiver is crucial. This is because the receiver has to detect a very weak signal while the transmitter is transmitting a signal that is several orders of magnitude larger in power. This isolation is usually provided by a duplexer possibly working in conjunction with several filters. As the separation in frequency ($\Delta F$) between the transmit frequency $F_{TX}$ and the receive frequency $F_{RX}$ decreases then it becomes increasingly difficult to achieve large isolation and consequently the filter design becomes more complex and requires filters of higher order.

A common approach to reduce the effect of out of band blocking signals (which includes the FDD transmit frequency) whilst minimising the degradation in receiver sensitivity is to use an external filter between a low noise amplifier and a mixer of the receiver. Such an arrangement is schematically illustrated in FIG. 1. The filters can be implemented in different technologies. Some of the most common technologies being surface or bulk acoustic wave filters and dielectric filters. These filters are external devices to the integrated circuit implementing the low noise amplifier and receiver. From the performance point of view this approach is very effective. However this requires the inclusion of pins to connect to this additional component, which in comparison with the integrated circuit is relatively expensive and large.

It is known in super heterodyne receivers to suppress the spurious image responses by use of an on-chip notch filter. The notch filter is often implemented with passive LC networks and is embedded either within the low noise amplifier or in a further transconductance stage of the mixer. It should however be noted that on chip spiral inductors have a relatively low Q factor where in this context Q represents the ratio of the inductive reactance of the inductor to the resistive impedance thereof. As a result, integrated LC notch filters, whilst highly integrated and avoiding the need to provide additional pins to external components, nevertheless have failed to deliver the required performance where the frequency difference between and wanted signal and the blocking or interfering signal is relatively small.

SUMMARY OF THE INVENTION

According to the first aspect of the present invention there is provided a circuit for synthesising a negative resistance, comprising first and second active devices, the first device having a control terminal connected to a first node, and the second device having a current flow terminal connected to the first node, and the first and second devices interacting with each other such that the circuit synthesises a negative resistance.

According to a second aspect of the present invention there is provided an integrated circuit including an inductor integrated therein, the inductor associated with a circuit for synthesising a negative resistance, said circuit comprising first and second transistors, the first transistor having a control terminal connected to a first terminal of the inductor, and the second transistor having a current flow terminal connected to the first terminal of the inductor, wherein the first and second transistors interact with each other to synthesise a negative resistance.

Preferably the inductor is part of a filter circuit which may, for example, be part of an amplifier.

It is thus possible to realise improved performance within an amplifier and within a frequency division duplex system including such an amplifier.

BRIEF DESCRIPTION OF THE DRAWINGS

The present invention will further be described, by way of example only, with reference to the accompanying drawings, in which.

DESCRIPTION OF PREFERRED EMBODIMENTS OF THE PRESENT INVENTION

Figure 1:
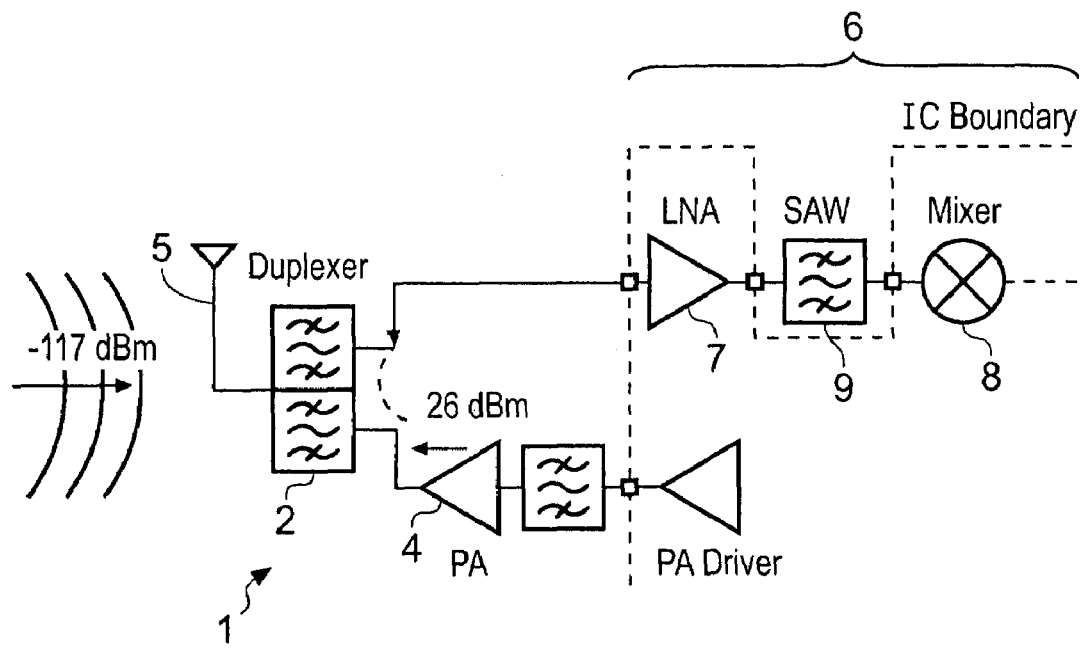
FIG. 1 schematically illustrates the inclusion of an external filter between a low noise amplifier and mixer to improve receiver performance against out of band blockers whilst minimising the degradation in receiver sensitivity within a FDD communication system.

As shown in FIG. 1, it is generally desired within a frequency division duplex communications device, generally designated 1, to use a duplexer 2 to separate power delivered from a power amplifier 4 to an antenna 5 from a signal received by the antenna and delivered to a receiver, generally designated 6. The receiver typically comprises a low noise amplifier 7 for receiving the incoming signal and amplifying this before passing it to a mixer 8. In order to enhance the receiver's selectivity and hence its ability to reject the interfering signal leaking from the power amplifier due to the finite isolation of the duplexer, a further filter such as a surface acoustic wave filter 9 is interposed between the low noise amplifier 7 and the mixer 8. It can be seen that the surface acoustic wave filter is not an integral part of an integrated circuit whereas the low noise amplifier 7 and the mixer 8 can be integrated within a single integrated circuit. Thus the inclusion of the surface acoustic wave filter uses two pins of the connections to the integrated circuit, and also requires the inclusion of an additional component.

It is known to provide on-chip LC notch filters in order to increase the attenuation available at the interfering frequency. It is also known that the depth of the notch can be improved by using a Q boosting circuit of the type shown in FIG. 2. Here transistor T1 represents the main amplifying device of a typical single-ended RF amplifier and T2 represents a device in cascode configuration with T1. The cascode configuration is well known to the person skilled in the art. An inductor L in series connection with capacitors CS1, CS2 and also connected to transistor T3 (having a parasitic gate source capacitance) forms a series resonant circuit attached to the node between transistors T1 and T2. At the frequency of the wanted signal the impedance of the series resonant circuit formed by L, CS1, CS2 and the gate source capacitance of T3 must be considerably larger than the impendence looking into the source of T2. The resonant circuit formed by the inductor L, CS1 and CS2 are selected to be in resonance at the frequency of the blocker signal and consequently most of the signal current at that frequency is shorted to ground. The amount of signal current shorted to ground is limited by the quality factor of the notch filter. In the arrangement shown in FIG. 2, T3 in combination with CS1, CS2 and the current source $I_B$ form the well known colpitts negative $g_m$ cell arrangement which is typically used to implement oscillators. The actively generated negative resistance partially compensates the losses due to the finite conductor resistance used to realise the inductor (and indeed the capacitors) within the integrated circuit and therefore enhances the overall quality factor of the notch.

It can be seen that there is also a parallel resonance between the inductor L and capacitor Cp, whose resonant frequency is set to match that of the received signal, and once again its performance is improved if the resistance associated with the inductor is reduced.

However, the improved notch Q comes with a penalty of higher noise, higher power consumption and increased complexity. In this implementation the extra noise is contributed by T3 and by the transistor (or resistor) used to implement the current source $I_b$. The notch frequency can be tuned by adjusting the capacitance of the capacitor. This can be implemented using a varactor or an array of switched capacitors.

Figure 2:
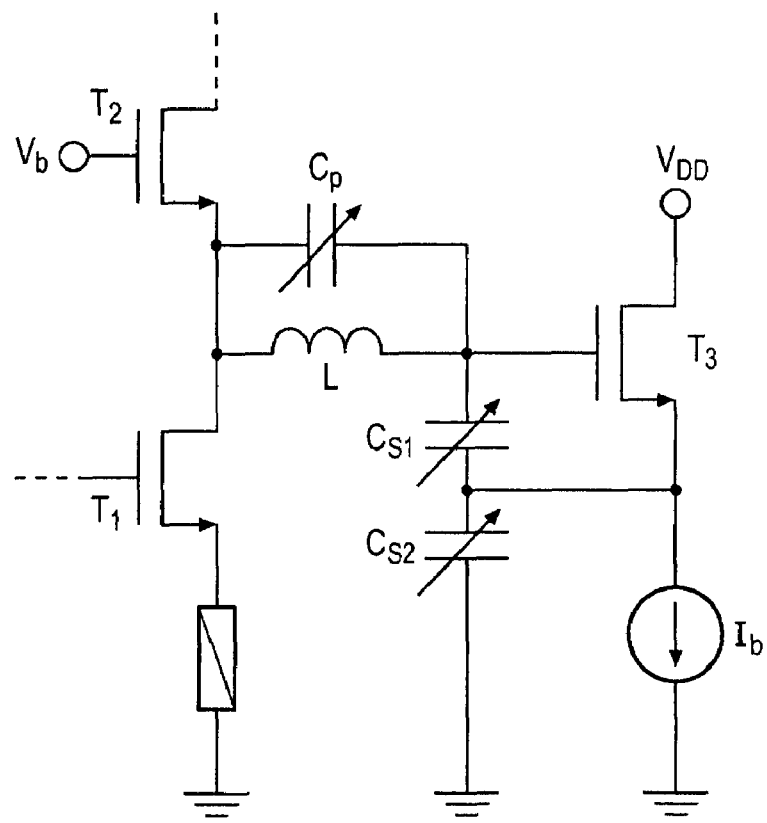
FIG. 2 schematically illustrates a colpitts cell.

The inventor has realised that it is possible to synthesis a negative resistance to be used within a LC filter while incurring less of a noise penalty than that of the arrangement shown in FIG. 2, and which was described by J. A. Macedo et al, "A 1.9 GHz Silicon Receiver with Monolithic Image Filtering", JSSC, Vol. 33, No. 3, March 1998.

Figure 3:
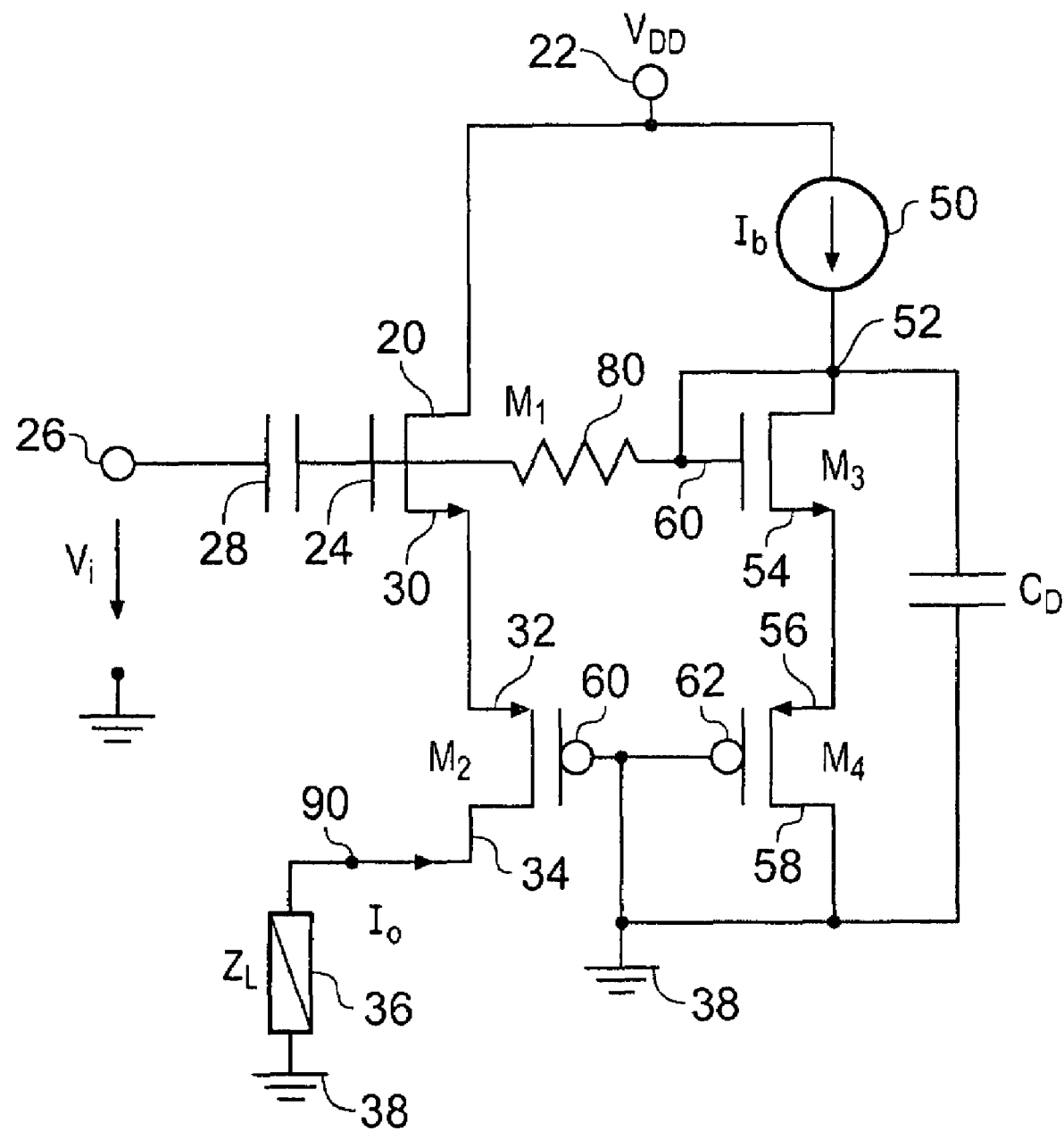
FIG. 3 schematically illustrates a negative-$g_m$ cell constituting an embodiment of the present invention.

FIG. 3 shows a negative $g_m$ cell constituting an embodiment of the invention.

The circuit comprises first to fourth transistors M1 to M4. The first transistor M1 is a N type device which has its drain 20 connected to a positive supply 22. A gate 24 of the first transistor M1 is connected to an input node 26 via a coupling capacitor 28. A source 30 of the first transistor M1 is connected to a source 32 of the second transistor M2, which is a P type device. A load 36 having an impedance $Z_L$ is connected between a drain of the second transistor M2 and a local ground 38.

The third and fourth transistors M3 and M4 are also connected in series, but now a current defining item, such as a current source 50 is connected to a drain 52 of the third transistor M3. The purpose of the current source 50 is to ensue that a defined current $I_b$ flows in transistors M3 and M4. A source 54 of transistor M3 is connected to a source 56 of transistor M4. A drain 58 of transistor M4 is connected to ground 38. Transistor M3 is an N type device whereas transistor M4 is a P type device.

A gate 60 of transistor M3 is connected to the drain 52 of transistor M3. This puts M3 in a diode like condition.

The transistors M3 and M4 are connected such that each has its respective gate connected to its respective drain. Furthermore, in order to bias M1, its gate is connected to the gate 60 of transistor M3 via a resistor 80. Resistor 80 has a relatively large resistance, for example several kilo Ohm. The action of transistors M3 and M4 is to bias transistor M1 into an operating state, and to keep transistor M1 properly biased. Process variations in the integrated circuit manufacture occur, or temperature changes in use could change the quiescent conditions of the circuit. However if we define S as the ratio of channel width to channel length, the $$\frac{S1}{S3} = \frac{S2}{S4}.$$

This circuit ensures that the bias potential at the gate of M1 is such that the quiescent drain current of M1 and M2 is $$I_b \times \frac{S1}{S3}.$$

In use, the circuit receives an alternating signal at its input 26. The signal is relatively small in amplitude and can be assumed not to perturb the DC bias conditions of the circuit significantly.

Suppose that a small increment, +V, is made at the input node 26. This is passed through the coupling capacitor 28 and causes a corresponding increase in the gate voltage at the gate 24 of the first transistor M1. As transistor M1 is in common drain configuration, this forces an increase in potential at its source 30.

Additionally, given that the source 30 of transistor M1 is coupled to the source 32 of transistor M2, then we can expect the voltage at the source 32 of M2 to undergo a corresponding voltage change.

As the gate voltage at the gate 60 of transistor M4 is held fixed (at ground in this example) then the gate source voltage of M2 changes with the gate becoming more negative with respect to the source. As M2 is a P type device this increases current flow into the load 36.

However, the current flow for the voltage increase is into the circuit at the input node, and out of the circuit as the drain of transistor M2. This gives the possibility of synthesising a negative resistance to AC signals when the input node 26 is connected to the drain of transistor 34.

If we look at the circuit performance in a more analytical manner, then as we know that the gate of M2 is grounded, we see using a small signal model that:

Equating voltages gives:

$$v_i = v_{gs1} + v_{sg2} \quad \text{Equation 1}$$

where
 $v_i$=change in input voltage
 $v_{gs1}$=change in gate-source voltage of transistor M1
 $v_{sg2}$=change in source-gate voltage of transistor M2 and if we let the admittance of the parasitic gate-source capacitor of M1 equal $sC_{gs1}$, and the admittance of the parasitic gate-source capacitor of M2 equal $sC_{gs2}$, where $s=j\omega$, and $\omega$ represents angular frequency, then:

Equating currents at the sources of M1 and M2 gives:

$$v_{gs1} \cdot sC_{gs1} + g_{m1} \cdot v_{gs1} = v_{sg2} \cdot sC_{gs2} + g_{m2} \cdot v_{sg2} \quad \text{Equation 2}$$

The output current is also given by:

$$i_o = -g_{m2} \cdot v_{sg2} \quad \text{Equation 3}$$

Re-arranging Equation 2 gives:

$$v_{gs1} = \frac{(g_{m2} + sC_{gs2}) \cdot v_{sg2}}{(g_{m1} + sC_{gs1})} \quad \text{Equation 4}$$

And, re-arranging Equation 3 gives:

$$v_{sg2} = \frac{-i_0}{g_{m2}} \quad \text{Equation 5}$$

Substituting from Equation 4 and Equation 5 into Equation 1 an re-arranging then gives the desired expression for the transconductance:

$$\frac{i_o}{v_i} = -G_{m0} \cdot \frac{\left[\frac{sC_{gs1}}{g_{m1}} + 1\right]}{\left[\frac{s \cdot (C_{gs1} + C_{gs2})}{(g_{m1} + g_{m2})} + 1\right]} \quad \text{Equation 6}$$

where $$G_{m0} = \frac{g_{m1} \cdot g_{m2}}{(g_{m1} + g_{m2})} \quad \text{Equation 7}$$

For a given bias current the gm cell has the largest transconductance when gm1=gm2. Furthermore, as noted before a negative resistance can be synthesised by connecting the input and output together.

Furthermore the dominant pole in the transfer function can be compensated for by positioning a zero in the transfer function by making $$\frac{C_{gs1}}{g_{m1}} = \left(\frac{C_{gs1} + C_{gs2}}{g_{m1} + g_{m2}}\right)$$

Consequently the stage can be made relatively broadband, even at low bias currents when the impedance of the source 30 of M1 to ground is relatively high.

If we consider the noise performance, then to a first order approximation the output thermal noise current spectral density is $$\frac{\overline{I_{no}^2}}{\Delta f} = 4KT\gamma G_{m0}$$

where $\overline{I_{no}^2}$ is average of the square of the noise current
$\Delta f$ is a frequency range
K is Boltzmann's constant
T is temperature in Kelvin
$\gamma$ is a noise parameter of MOS transistors
$G_{m0}$ is the transconductance of the cell Thus the cell generates about the same amount of thermal noise as a single transistor having the same transconductance magnitude, even though it actually has four transistors.

The noise generated by the bias circuit namely current source 50 and transistors M3 and M4 is to all intents and purposes removed by a low pass filter formed by resistor 80 and the capacitor $C_D$. This is in contrast with the circuit shown in FIG. 2.

Figure 4:
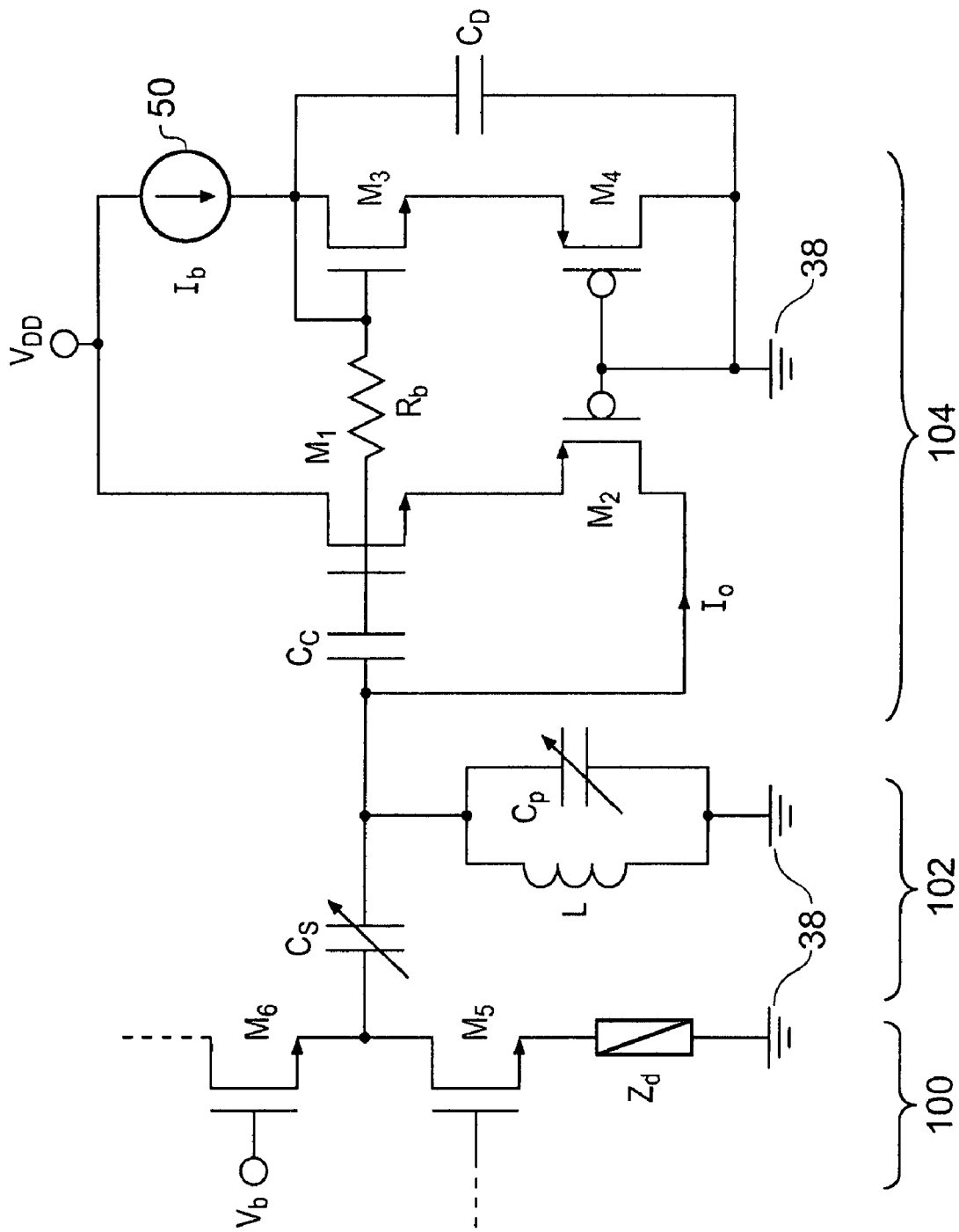
FIG. 4 is a circuit diagram of a filter within a receiver constituting an embodiment of the present invention.

FIG. 4 illustrates an example circuit in which a low noise amplifier is generally designated 100. The amplifier is coupled to an LC resonant circuit, generally designated 102, and also to a negative $g_m$ cell of the type shown in FIG. 3 and designated 104.

The amplifier stage 100 is a well known and standard circuit configuration. A signal to be amplified is supplied to the gate of transistor M5 and causes a modulation in the output current passing through the transistor, and which is sunk into the drain of the cascode transistor M6.

The load for transistor M5 also comprises the LC resonant circuit 102. In fact it can be seen that there are two resonant circuits. In particular there is a parallel resonant circuit formed by the inductor L and capacitor $C_P$ which is designed to resonate at the receiver frequency $F_{RX}$ and a series resonant circuit formed by the inductor L and the capacitor $C_S$ which is designed to resonate at the transmitter frequency $F_{TX}$. This series resonance lies at a lower frequency than the parallel resonance and hence this filter configuration is restricted to use in networks where the transmit frequency is lower than the receive frequency. This condition applies to the user terminal in the UMTS system (i.e. the user's mobile phone).

For ideal circuits, the impedance of a parallel resonant circuit approaches infinity at resonance whereas the impedance of a series resonance circuit approaches zero at resonance. Under these conditions, it can therefore be seen that the signal occurring from the transmitter at $F_{TX}$ will be completely shorted to ground whereas the wanted signal at $F_{FX}$ will flow through the cascode transistor and to the rest of the receiver without attenuation by the notch network. However these ideal conditions are not generally realised because of the finite Q of the integrated inductor.

Although the integrated inductor is more easily thought of as comprising an ideal inductor with a series resistor, over a limited frequency range the impedance of a real inductor can be approximately represented by an ideal inductor in parallel with a resistor. This is an acceptable transformation to make because the interfering signal $F_{TX}$ only occurs over a narrow and fixed bandwidth. Therefore the transformation is valid within the context of the invention. It is therefore possible to estimate the effective parallel resistance R that occurs in parallel with the inductor. It can also be seen that if this parallel resistance R is then placed in parallel with a synthesised negative resistance −R then the notch filter's performance will more closely approximate that of the ideal notch filter and hence the quality factor of the filter will increase and the interfering signal becomes progressively more rejected by the filter. The relative sizes of the synthesised negative resistance to the real inductor's resistance may be selected by the circuit designer to avoid oscillation.

It is also worth noting that the arrangement shown in FIG. 4 does not require a topological change to the passive LC network, as would be the case if a colpitts cell was used.

The circuit has significant advantages over synthesising a negative resistance using a colpitts cell. It has already been noted that the noise performance is improved compared to a colpitts cell. It can be seen that the circuit of FIG. 2 requires, three variable capacitors (to account for process variations) whereas the present invention only requires two. Furthermore each capacitor CS1 and CS2 of FIG. 2 has to be twice the size of CP of FIG. 4. Thus the present invention has significant space saving advantages, especially when the variable capacitor is itself formed of a switched capacitor array. In addition the bias current required by the present invention to generate a given negative resistance is considerably smaller than that required by the circuit of FIG. 2.

Figure 5:
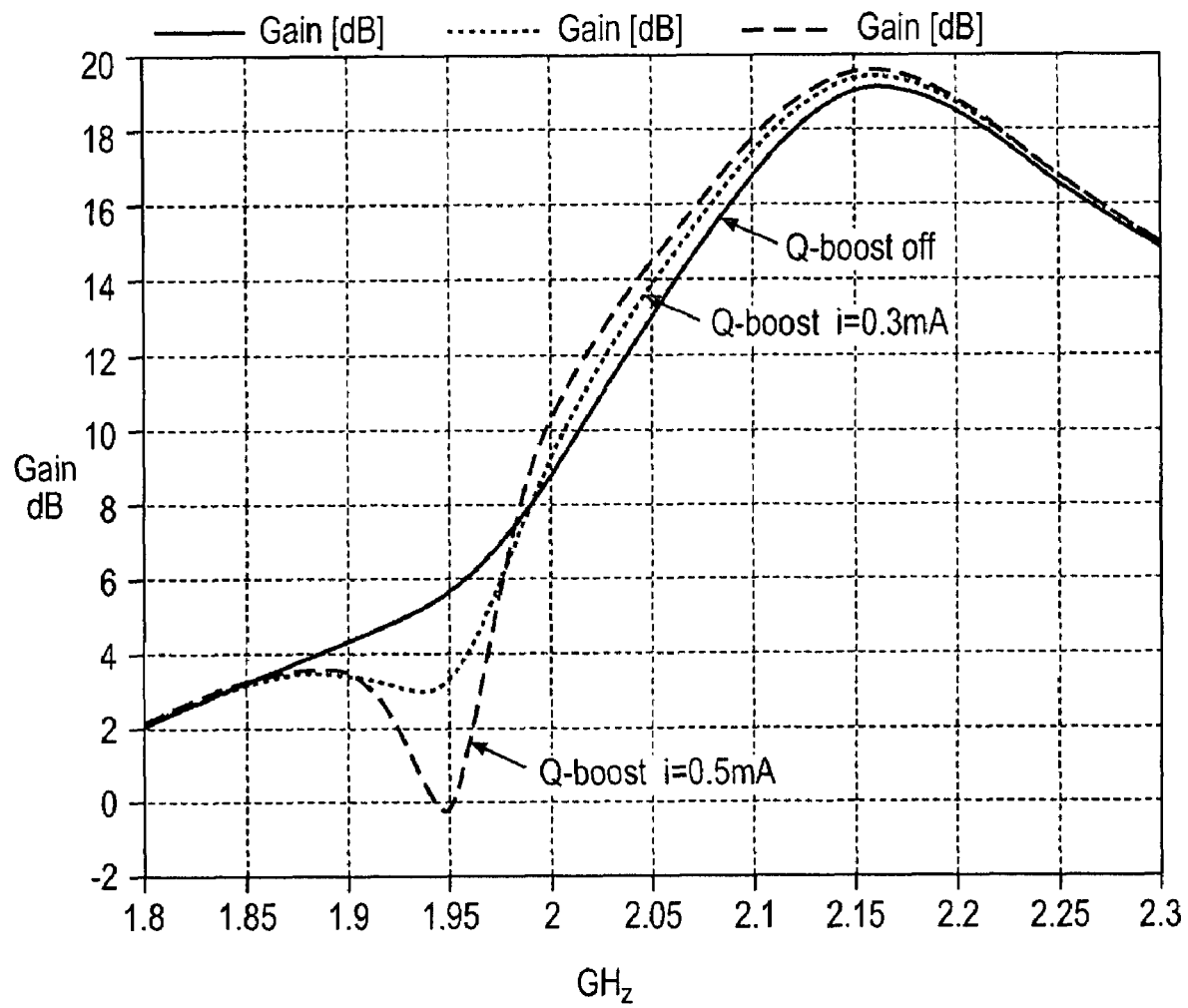
FIG. 5 is a graph comparing circuit performance with changing bias current.

FIG. 5 shows the gain in dB of an low noise amplifier fabricated within an integrated circuit, with the resonant circuit also fabricated within the integrated circuit. The amplifier included a negative $g_m$ cell in accordance with the invention. The transconductance of the cell can be controlled by adjusting the bias current $I_b$.

The amplifier performance was tested in a UMTS mobile phone receiver operating in band 1. The receive range spans 2110 MHz to 2170 MHz while the transmit frequency is between 1920 MHz and 1980 MHz. The duplex frequency separation is 190 MHz independent of channel.

It can be seen that the rejection notch at the transmit frequency is not very large when the negative $g_m$ circuit is not operating. In fact, the passive notch gives around 3.5 dB of attenuation at the transmit frequency. However the notch becomes more pronounced as the bias current is increased, and at $I_b$=0.5 mA the amplifier gain at the transmit frequency has been reduced by around a further 6 dB, while the gain at the receive frequency has also improved slightly.

Figure 6:
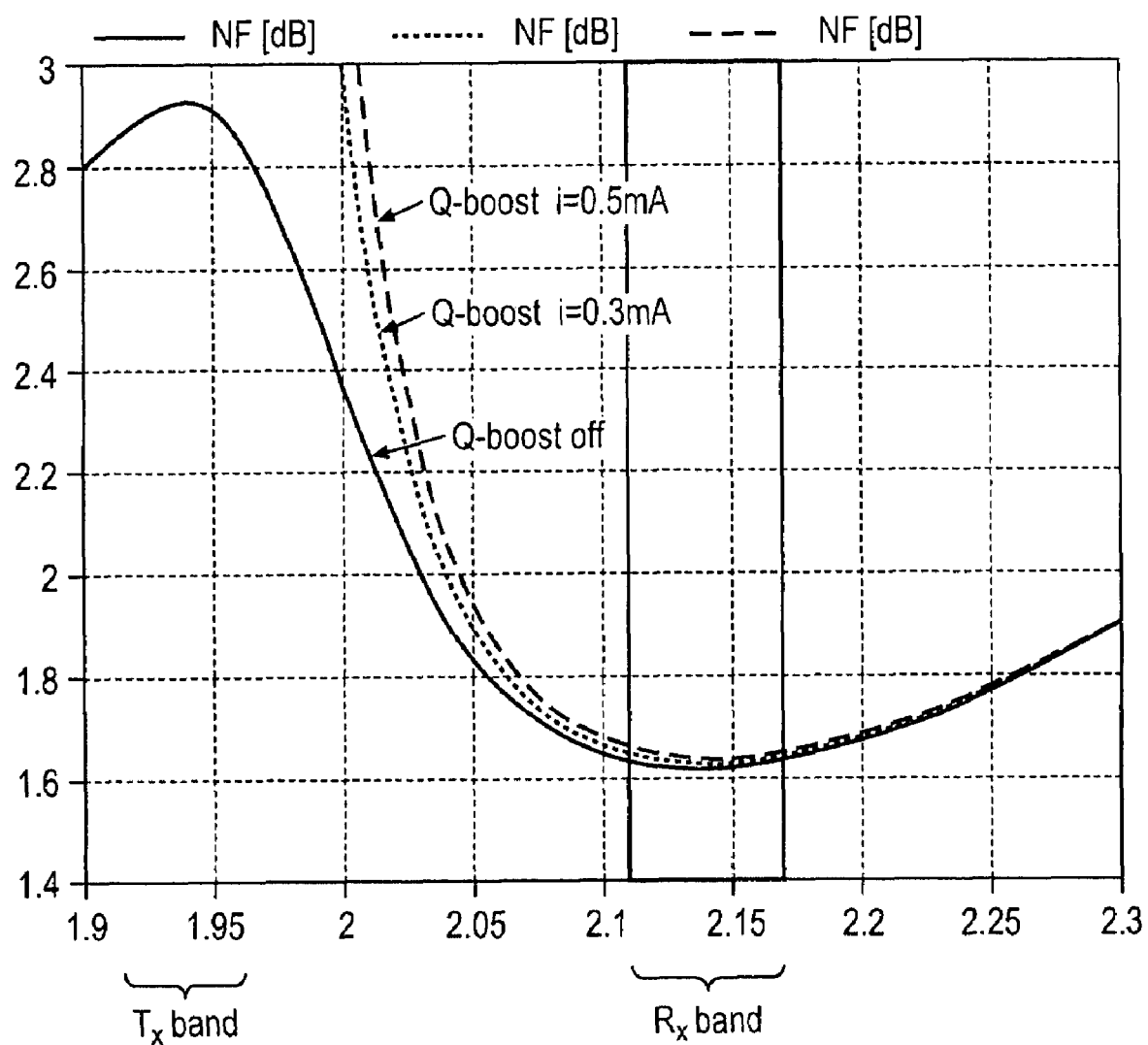
FIG. 6 is a graph showing noise performance.

FIG. 6 compares noise performance of the circuit of FIG. 4 at various quiescent current levels. The important feature to note is that the noise level within the receive frequency band remains largely unaltered between not having the negative resistance circuit enabled, and having it operative. Noise levels out of the receive band ($R_X$ band) are increased a little, but the additional noise in the transmit frequency ($T_X$ band) range is insignificant as the noise is swamped by the interfering signal.

It is thus possible to provide an arrangement for compensating for the resistance of an inductor and which enables integrated LC resonant circuits to be used within a frequency division duplex device, such as a mobile terminal in a telecommunications network, such as UMTS telephone system.

Although the invention has been described as a circuit using field effect transistors, it can also be implemented using bipolar transistors.

The invention claimed is:

1. A circuit for synthesizing a negative resistance, comprising first and second transistors, the first transistor having a control terminal connected to a first node, and the second device transistor having a current flow terminal connected to the first node, and the first and second transistors interacting with each other such that the circuit synthesizes a negative resistance, wherein the first and second transistors are connected in series, the first transistor is an N type device and the second transistor is a P type device, and a bias circuit is provided for biasing the transistors into an operating state, wherein the bias circuit comprises third and fourth series connected transistors.

2. A circuit as claimed in claim 1, in which the second transistor has a control terminal thereof held at a fixed voltage.

3. A circuit as claimed in claim 1, in which the first and second transistors are field effect transistors, and a source terminal of the first transistor is connected to a source terminal of the second transistor, and a drain terminal of the second transistor is connected to the first node.

4. A circuit as claimed in claim 1, further including a current control device in series with the third transistor.

5. A circuit as claimed in claim 4, in which the third transistor is a field effect transistor, and the current control device is connected in series with a drain of the third transistor.

6. A circuit as claimed in claim 1, further including a bias circuit, wherein the bias circuit comprises a third transistor in series with a current control device, and wherein the third transistor is a field effect transistor having its gate connected to its drain, and the gate of the first transistor is biased to be at the same potential as the gate of the third transistor.

7. An amplifier in combination with a load comprising an inductor, and further in combination with a circuit for synthesizing a negative resistance as claimed in claim 1.

8. An amplifier as claimed in claim 7, wherein the load further comprises a capacitor such that the inductor and capacitor form a resonant circuit.

9. An integrated circuit including an inductor integrated therein, the inductor associated with a circuit for synthesising a negative resistance, said circuit comprising first and second transistors, the first transistor having a control terminal connected to a first terminal of the inductor, and the second transistor having a current flow terminal connected to the first terminal of the inductor, wherein the first and second transistors interact with each other to synthesise a negative resistance.

10. An integrated circuit as claimed in claim 9, further including a bias arrangement for biasing the first and second transistors to pass a quiescent current.

11. An integrated circuit as claimed in claim 9, wherein the integrated circuit includes an amplifier or a mixer, and the inductor is associated with at least one capacitor to form at least one of a band pass filter and a band stop filter.

12. A circuit for synthesizing a negative resistance, comprising first and second field effect transistors, the first transistor having a control terminal connected to a first node, and the second transistor being an enhancement mode transistor having a current flow terminal connected to the first node, and the first and second transistors interacting with each other such that the circuit synthesizes a negative resistance.

13. A circuit as claimed in claim 12, in which the second device has a control terminal thereof held at a fixed voltage.

14. A circuit as claimed in claim 12, in which the first transistor is an N type device and the second transistor is a P type device.

15. A circuit as claimed in claim 14, in which a source terminal of the first transistor is connected to a source terminal of the second transistor, and a drain terminal of the second transistor is connected to the first node.

16. A circuit as claimed in claim 12, further including a bias circuit, wherein the bias circuit comprises a third transistor in series with a current control device, and wherein the third transistor is a field effect transistor having its gate connected to its drain, and the gate of the first transistor is biased to be at the same potential as the gate of the third transistor.

17. An amplifier in combination with a load comprising an inductor, and further in combination with a circuit for synthesising a negative resistance as claimed in claim 12.

18. A circuit as claimed in claim 12, further including a bias circuit for biasing the first transistor into an operating state.

19. A circuit as claimed in claim 12, further including a signal input node and a capacitor interconnecting the signal input node to the control terminal of the first transistor.

* * * * *